(12) United States Patent
Tseng (10) Patent No.: US 11,017,973 B2
(45) Date of Patent: May 25, 2021

(54) HEAT SINK APPARATUS FOR MICROWAVE MAGNETRON

(71) Applicants: Ton-Rong Tseng, New Taipei (TW); Mastek Technologies, Inc., New Taipei (TW)

(72) Inventor: Ton-Rong Tseng, New Taipei (TW)

(73) Assignees: Ton-Rong Tseng, New Taipei (TW); MASTEK TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 16/697,263

(22) Filed: Nov. 27, 2019

(65) Prior Publication Data

US 2020/0176213 A1    Jun. 4, 2020

(30) Foreign Application Priority Data

Nov. 30, 2018   (TW) .................................. 107142859

(51) Int. Cl.
| | |
|---|---|
| *H01J 23/00* | (2006.01) |
| *H01J 25/50* | (2006.01) |
| *H05B 6/64* | (2006.01) |
| *H05K 7/20* | (2006.01) |

(52) U.S. Cl.
CPC ............ *H01J 23/005* (2013.01); *H01J 25/50* (2013.01); *H05K 7/20* (2013.01)

(58) Field of Classification Search
CPC ........ H01J 23/00; H01J 23/005; H01J 23/075; H01J 25/00; H01J 25/20; H01J 37/3222; H05K 7/20; H05B 6/64; H05B 6/642
See application file for complete search history.

(56) References Cited

U.S. PATENT DOCUMENTS

| | | | |
|---|---|---|---|
| 6,894,900 B2* | 5/2005 | Malone | F28F 1/32 361/700 |
| 2006/0175045 A1* | 8/2006 | Chen | H01L 23/427 165/104.33 |
| 2010/0226831 A1* | 9/2010 | Lee | H05H 1/46 422/186.03 |
| 2017/0214150 A1* | 7/2017 | Zhao | H01Q 21/0025 |

FOREIGN PATENT DOCUMENTS

| | | |
|---|---|---|
| CN | 1267949 C | 8/2006 |
| TW | M350974 U1 | 2/2009 |
| TW | 200930275 A | 7/2009 |

* cited by examiner

*Primary Examiner* — Thai Pham (74) *Attorney, Agent, or Firm* — Locke Lord LLP; Tim Tingkang Xia, Esq.

(57) ABSTRACT

A heat sink apparatus for a microwave magnetron includes a thermal conduction seat, a first heat-fin set, and at least one first heat pipe. One end of the first heat pipe protrudes into the thermal conduction seat, while another end of the first heat pipe protrudes into the first heat-fin set. An antenna of the microwave magnetron is to penetrate through the thermal conduction seat.

13 Claims, 7 Drawing Sheets

HEAT SINK APPARATUS FOR MICROWAVE MAGNETRON

CROSS REFERENCE TO RELATED APPLICATION

This application claims the benefit of Taiwan Patent Application Serial No. 107142859, filed on Nov. 30, 2018, the subject matter of which is incorporated herein by reference.

BACKGROUND OF THE INVENTION

(1) Field of the Invention

The invention relates to a heat sink apparatus for a microwave magnetron, and more particularly to the heat sink apparatus that can provide better heat dissipation performance for microwave magnetrons.

(2) Description of the Prior Art

Versatile applications in microwave technology are mainly attributed to two inventions in 30's: the magnetron and the waveguide. Actually, in world war II, the microwave technology has been successfully used to develop radars and communicative components.

After world war II, besides more widely applications in military technology, output powers and energies in applications of the microwave and the magnetron have been enhancing. Further, the applications are also extended to livelihood and industrial fields. For example, the domestic microwave oven is one of many innovative developments in the aforesaid applications. For more examples, these innovative developments include medium and large power microwave heating equipments, microwave chemical digestion and polymerization reactors, microwave plasma generators and sources, microwave high-brightness light sources and so on.

As described above, for these microwave applications, the magnetron is one of milestones that played important roles. Features of the magnetron include concise structuring, simple designs, small sizes, high power densities, big powers, higher stability, and ease in designing power supplies and output control, and thus the magnetron becomes one of the most common components for the microwave generators.

Nevertheless, the magnetron might have some shortcomings such as narrower work bandwidths, less adjustability in frequencies, and huge heat dissipation needs within a tiny volume.

For the small and medium power magnetron having a power within 200 W~3000 W, the heat dissipation mechanism required for stable operation is at least an enforced air-cooling set or a water-cooling set. On the other hand, for large power magnetron or microwave equipment, the heat dissipation mechanism is usually a water-cooling set.

Though the small and medium power magnetron can be cooled by enforced air cooling, yet the situation of excessive work temperature or the output power approaching the limit of heat-dissipation fan can be still met. Thus, for the equipment working in a severe environment, the water-cooling heat-dissipation mechanism is generally the better choice.

Further, for the magnetron dissipated by a water-cooling set, a poor heat dissipation efficiency may be met while a jam occurs in the heat-dissipation pipe or the related piping. At this situation, the magnetron would be eventually damaged or failed, or the related manufacturing process may be affected by water leak, for example. Thereupon, it is quite possible that a major production loss or equipment damage would be resulted anyway.

SUMMARY OF THE INVENTION

Accordingly, it is an object of the present invention to provide a heat sink apparatus for a microwave magnetron that utilizes heat pipes to dissipate the heat. Thus, by comparing to the conventional air-cooling or water-cooling heat-dissipation set, a better heat dissipation performance can be obtained by applying the heat sink apparatus of the present invention.

In this present invention, the heat sink apparatus for a microwave magnetron includes a thermal conduction seat, a first heat-fin set, and at least one first heat pipe. One end of the first heat pipe protrudes into the thermal conduction seat, while another end thereof protrudes into the first heat-fin set. The thermal conduction seat allows an antenna of the microwave magnetron to penetrate therethrough.

In one embodiment of the present invention, a first heat-dissipation fan is further included and mounted to the first heat-fin set, and the first heat-fin set further has a lateral shield. The first heat pipe is one of a flat heat pipe and a plurality of heat pipes.

In one embodiment of the present invention, at least one second heat pipe and a second heat-fin set are further included. One end of the second heat pipe penetrates into the thermal conduction seat, and another end of the second heat pipe extends into the second heat-fin set.

In one embodiment of the present invention, a second heat-dissipation fan is further included and mounted to the second heat-fin set. In addition, the second heat-fin set further has a lateral shield, and the second heat pipe is one of a flat heat pipe and a plurality of heat pipes.

In one embodiment of the present invention, the thermal conduction seat has a first block and a second block, the first block has a first half-moon cavity, and the second block has a second half-moon cavity. As the first block and the second block are paired together to form the thermal conduction seat, the first half-moon cavity and the second half-moon cavity are integrated to form a central hole for allowing the antenna to penetrate therethrough.

In one embodiment of the present invention, one end of the first heat pipe penetrates through the first block, and another end of the first heat pipe penetrates through the first heat-fin set and protrudes into the second block.

In one embodiment of the present invention, one end of the first heat pipe protrudes into the first heat-fin set, and another end of the first heat pipe protrudes into the first block; wherein one end of the second heat pipe protrudes into the second heat-fin set, and another end of the second heat pipe protrudes into the second block.

As stated, by providing the heat sink apparatus for a microwave magnetron of the present invention, by comparing to the conventional air-cooling or water-cooling heat-dissipation set, a better heat dissipation performance can be obtained by applying the heat sink apparatus of the present invention.

All these objects are achieved by the heat sink apparatus for a microwave magnetron described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a heat sink apparatus for a microwave magnetron. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
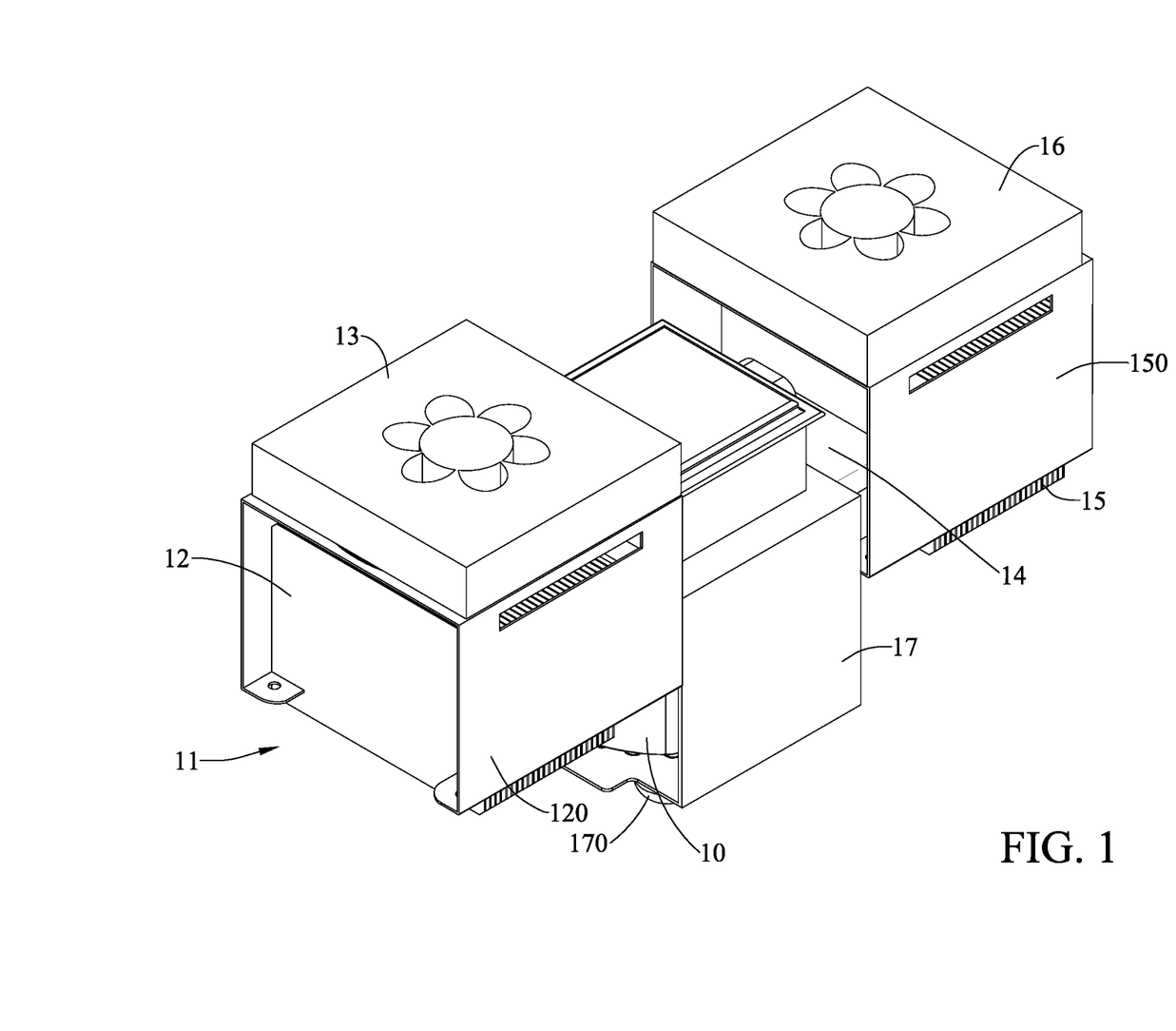
FIG. 1 is a schematic perspective view of a first embodiment of the heat sink apparatus for a microwave magnetron in accordance with the present invention.
Figure 2:
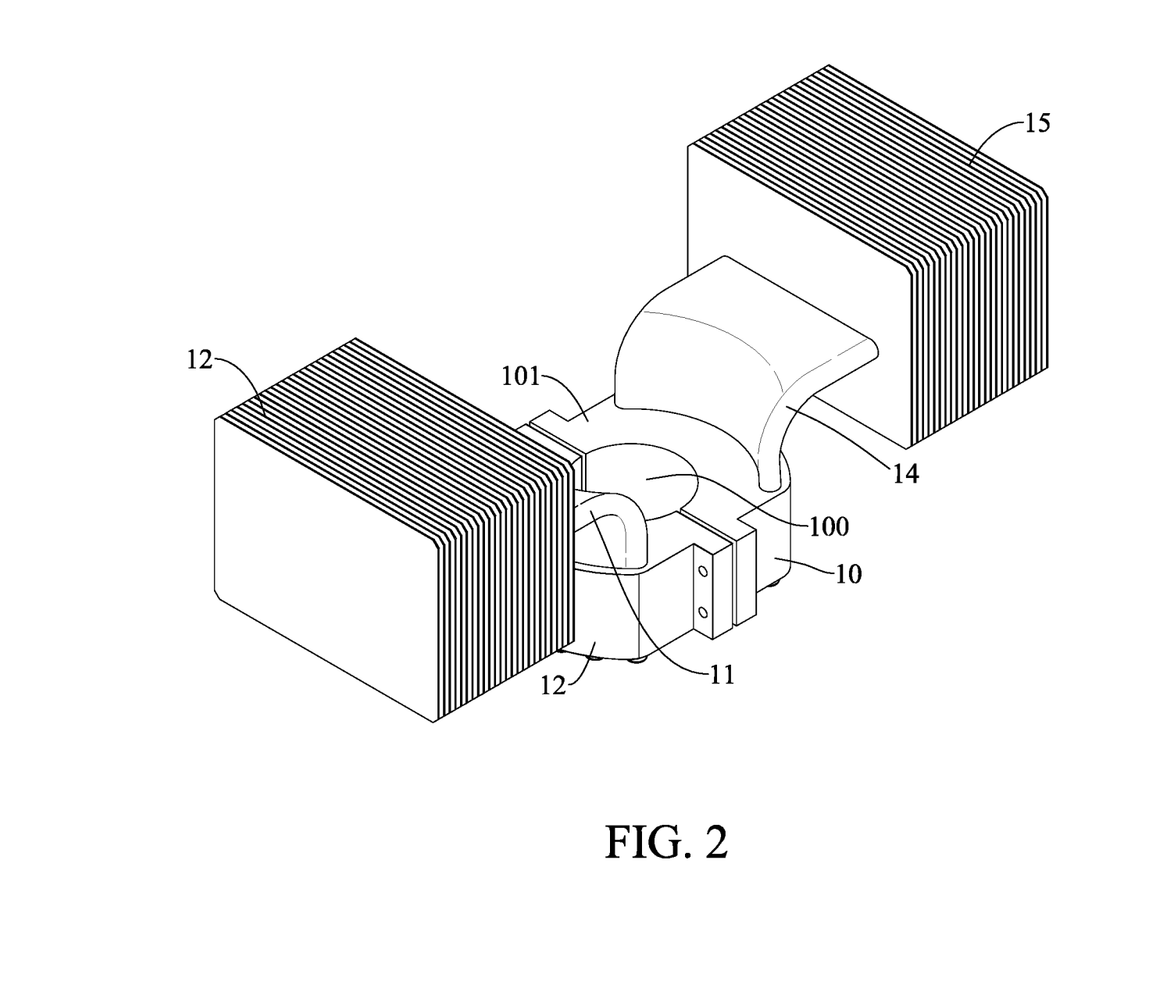
FIG. 2 shows a portion of FIG. 1.

Referring now to FIG. 1 and FIG. 2, a first embodiment of the heat sink apparatus for a microwave magnetron is shown. The heat sink apparatus includes a thermal conduction seat 10, at least one first heat pipe 11, a first heat-fin set 12, a first heat-dissipation fan 13, a at least one second heat pipe 14, a second heat-fin set 15 and a second heat-dissipation fan 16.

The thermal conduction seat 10, made of a conductive metal (a copper for example), has a central hole 100 for allowing an output antenna 170 of a microwave magnetron 17 to penetrate therethrough. Further, the thermal conduction seat 10 has a first block 101 and a second block 102. A first half-moon cavity is formed to one side of the first block 101, and a second half-moon cavity is formed to another side of the second block 102. As the first block 101 and the second block 102 are paired together to form the thermal conduction seat 10, the first half-moon cavity and the second half-moon cavity would be integrated together to form the central hole 100 of the thermal conduction seat 10.

The microwave magnetron 17 has a first magnet, a cathode, an anode, a second magnet and a fin set. The output antenna 170 penetrates through the first magnet, the cathode, the anode and the second magnet. The fin set is mounted exterior to the first magnet, cathode, the anode and the second magnet.

In addition, the microwave magnetron 17 has the cathode and the anode to form a diode as a core structure, magnetic poles and and output antenna. The microwave magnetron 17, as a vacuum tube having a diode structure, includes mainly the cathode for generating an electron beam, the anode for receiving the electron beam, a microwave resonant chamber for transforming the electron beam into corresponding microwave, and an output antenna for leading the microwave out of the resonant chamber.

The cathode is structured as a tube-shape high-temperature resistant filament made of a high-temperature resistant material, such as W, Th, W—Th alloy, or a rare earth alloy. The purpose of using the rare earth material is to generate more thermal electrons for enhancing output power.

The anode is made of a high-purity oxygen-free copper with low electric conductivity and high thermal conductivity.

The core structure includes a combination of a central filament and the cathode, and the anode surrounding the cathode. The anode has an internal hole or cavity as a resonant cavity for microwave oscillations. A space between the cathode and the anode is used as an electron pathway.

The filament as the cathode is connected with a low voltage, i.e., further with a negative end of the power source for the microwave generator. On the other hand, the anode is connected to a positive end (usually the ground) of the power source. Generally, the power source for the microwave magnetron 17 is a high-voltage electric source.

The core structure is sandwiched between two lateral magnets parallel arranged vertically to opposing sides of the anode, so that the corresponding magnetic lines can be parallel to the line connecting the anode and the cathode.

The first heat pipe 11 can be a flat heat pipe or a plurality of heat pipes. One end of the first heat pipe 11 is protruded into the first heat-fin set 12, while another end of the first heat pipe 11 is extended into the first block 101 of the thermal conduction seat 10.

The first heat-dissipation fan 13 is mounted onto the first heat-fin set 12 further having a lateral shield 120. The lateral shield 120, located under the first heat-dissipation fan 13, is to cover the first heat-fin set 12.

The second heat pipe 14 can be a flat heat pipe or a plurality of heat pipes. One end of the second heat pipe 14 is protruded into the second block 102 of the thermal conduction seat 10, while another end of the second heat pipe 14 is extended into the second heat-fin set 15.

The second heat-dissipation fan 16 is mounted onto the second heat-fin set 15 further having a lateral shield 150. The lateral shield 150, located under the second heat-dissipation fan 16, is to cover the second heat-fin set 15.

Both the first heat pipe 11 and the second heat pipe 14 have the following advantages: high thermal conductivity for better thermal conduction in both capacity and distance, uniform temperature distribution for equalizing the temperature, being a passive element with low electricity consumption, no specific heat-conduction direction easy for altering the thermal route and thus for exchange of the evaporating end and the condensing end, ease in design and machining, light weight and simple structuring, long service life, reliability, and easy storage.

In view of the heat-dissipation capacity and the heat source, the heat source (to generate heat) at the microwave magnetron is at the core area surrounded by the anode, including heat generated by the high-temperature filament and during the transformation from the electricity to the microwave. For a typical microwave magnetron with a power less than 10 KW, the anode may have a diameter about 4.5 cm, a height about 5.0 cm, a computed volume about 79.5 cm$^3$ (ml), and a surface area about 70.7 cm$^2$. Based on a 1285 W heat-dissipation need to calculate the heat-dissipation capacity, the heat-dissipation rate per unit square centimeter is about 18.2 W/cm$^2$.

Figure 3:
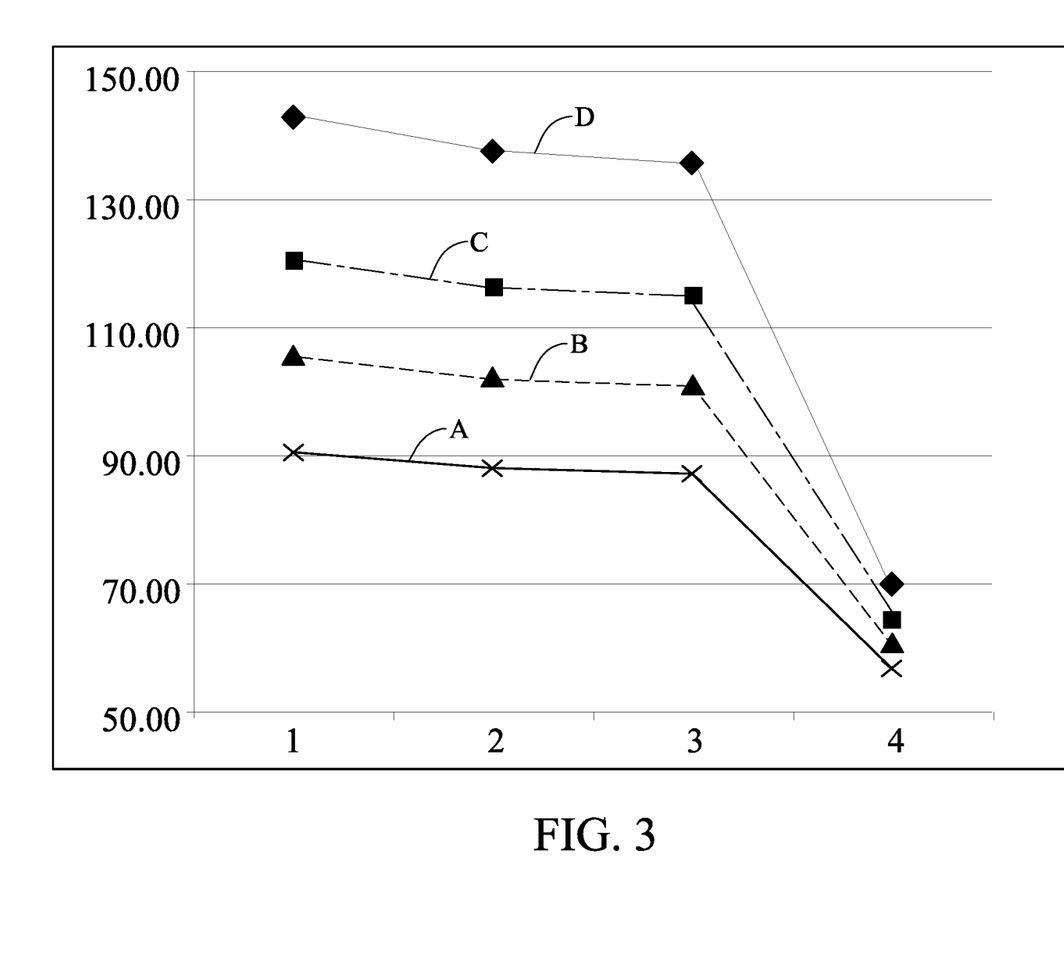
FIG. 3 shows schematically changes of heat-dissipation temperature gradients for 8 heat pipes under 600 W, 800 W, 1000 W and 1300 W, respectively.

Referring now to FIG. 3, in this embodiment, each of the first heat pipe 11 and the second heat pipe 14 has 8 heat pipes, and the heat-dissipation power for testing is set to be 600 W, 800 W, 1000 W and 1300 W, respectively.

TABLE 1

|  | 600 W | 800 W | 1000 W | 1300 W |
|---|---|---|---|---|
| Core of heat source | 90.23° C. | 105.28° C. | 120.32° C. | 142.83° C. |
| Around heat source | 87.77° C. | 102.00° C. | 116.21° C. | 137.48° C. |
| Heat-dissipation fins | 87.07° C. | 101.07° C. | 115.05° C. | 135.98° C. |
| Out of heat-dissipation fins | 56.44° C. | 60.25° C. | 64.04° C. | 69.73° C. |

As shown in FIG. 3, curve A stands for the changes of heat-dissipation gradients for the heat-dissipation power 600 W of Table 1, curve B stands for the changes of heat-dissipation gradients for the heat-dissipation power 800 W of Table 1, curve C stands for the changes of heat-dissipation gradients for the heat-dissipation power 1000 W of Table 1, and curve D stands for the changes of heat-dissipation gradients for the heat-dissipation power 1300 W of Table 1. Referring to Table 1 and FIG. 3, by giving a 8-pipe example, as the heat-dissipation power is raised from 600 W to 1300 W, the temperature at the core of the heat source would be raised by about 53° C., while that out of the heat-dissipation fins is raised by about 14° C.

Figure 4:
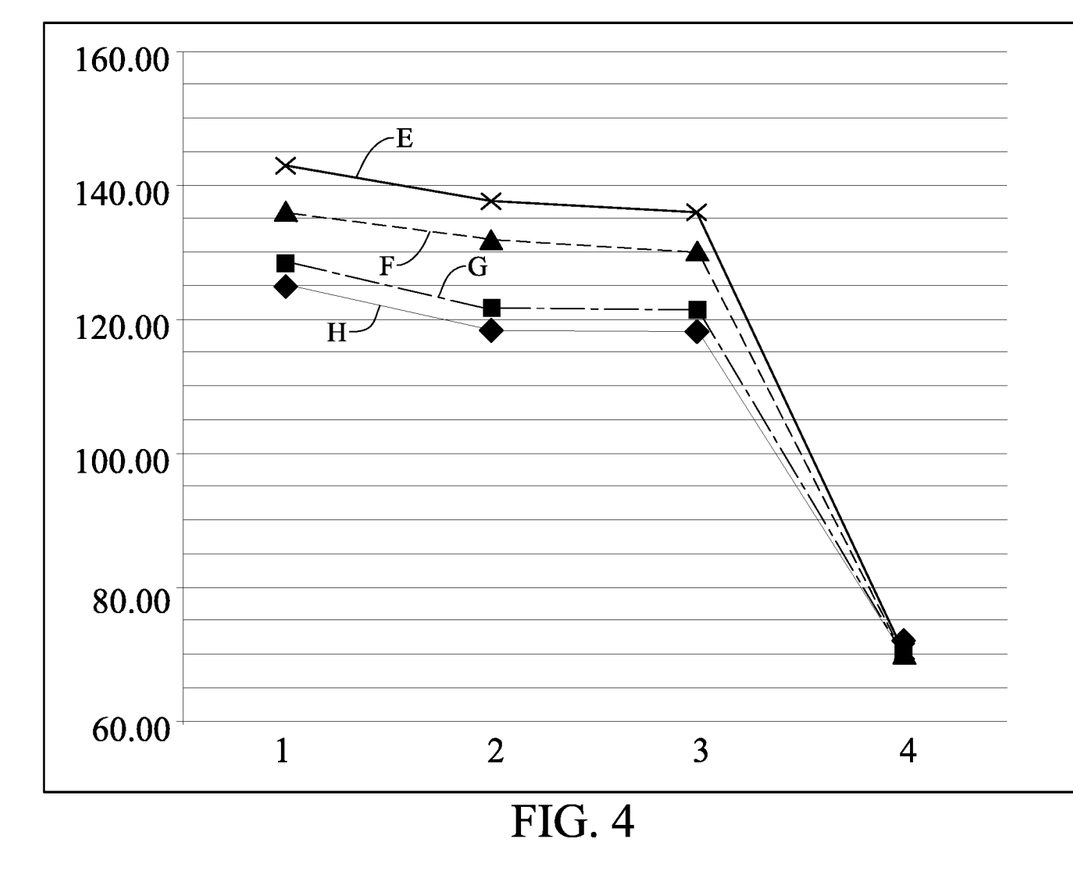
FIG. 4 shows schematically changes of heat-dissipation temperature gradients for 8, 10, 12 and 14 heat pipes, respectively.

Referring now to FIG. 4, in this embodiment, the number of the heat pipes (including both the first heat pipe 11 and the second heat pipe 14) is set to be 8, 10, 12, 14 heat pipes, respectively, and the heat-dissipation power for testing is set to 1300 W.

TABLE 2

|  | 8 pipes | 10 pipes | 12 pipes | 14 pipes |
|---|---|---|---|---|
| Code of heat source | 142.83° C. | 135.86° C. | 128.30° C. | 124.74° C. |
| Around heat source | 137.48° C. | 131.78° C. | 121.60° C. | 118.21° C. |
| Heat-dissipation fins | 135.98° C. | 130.12° C. | 1121.35° C. | 118.12° C. |
| Out of heat-dissipation fins | 69.73° C. | 69.17° C. | 69.78° C. | 71.49° C. |

As shown in Table 2 and FIG. 4, curve E stands for changes of heat-dissipation gradients for the testing of 8 pipes, curve F stands for changes of heat-dissipation gradients for the testing of 10 pipes, curve G stands for changes of heat-dissipation gradients for the testing of 12 pipes, and curve H stands for changes of heat-dissipation gradients for the testing of 14 pipes. From Table 2 and FIG. 4, it is observed that, under the 1300 W heat-dissipation power, temperatures at the core of the heat source between 8-pipe and 14-pipe examples are differed by about 18° C., and those out of the heat-dissipation fins are differed by about 1.8° C.

Figure 5:
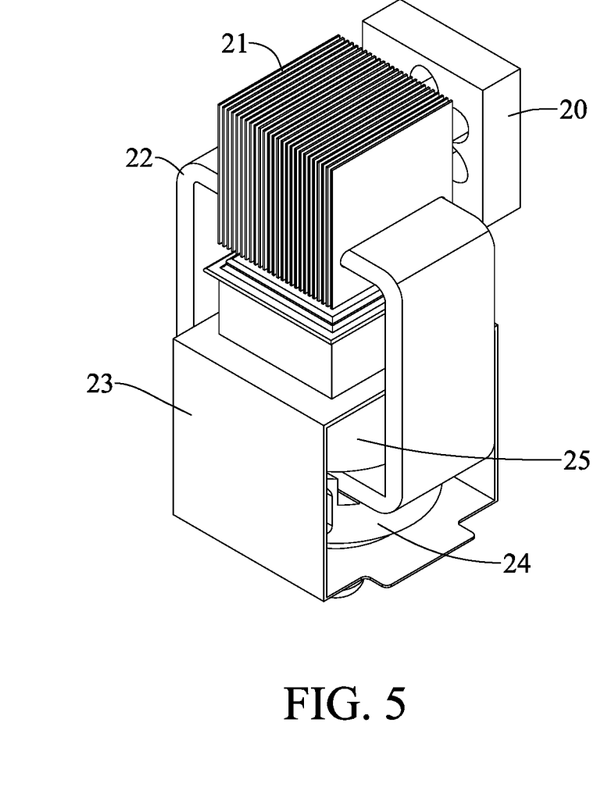
FIG. 5 is a schematic perspective view of a second embodiment of the heat sink apparatus for a microwave magnetron in accordance with the present invention.
Figure 6:
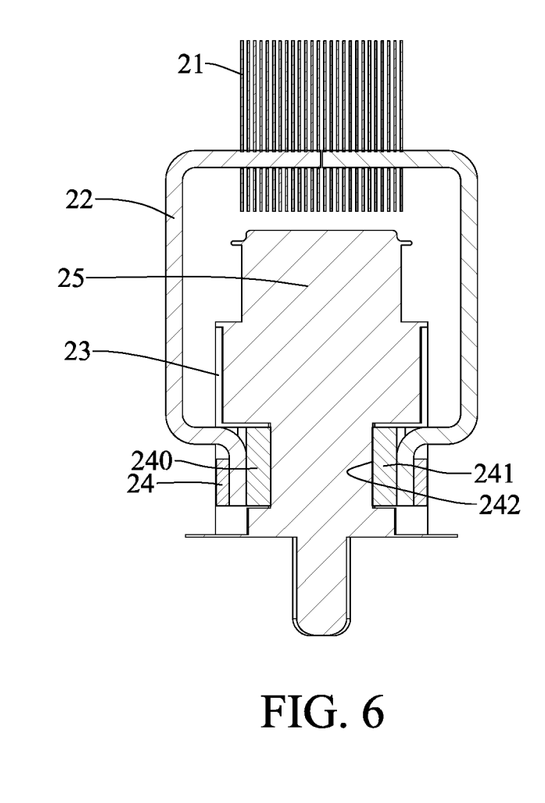
FIG. 6 is a schematic cross-sectional view of FIG. 5.

Referring now to FIG. 5 and FIG. 6, a second embodiment of the heat sink apparatus for a microwave magnetron is shown. This embodiment include a thermal conduction seat 24, at least one first heat pipe 22, a first heat-fin set 21 and a first heat-dissipation fan 20.

The thermal conduction seat 24 has a central hole 242 for allowing an output antenna of a microwave magnetron 25 to penetrate therethrough. Further, the thermal conduction seat 24 has a first block 240 and a second block 241. A first half-moon cavity is formed to one side of the first block 240, and a second half-moon cavity is formed to another side of the second block 241. As the first block 240 and the second block 241 are paired together to form the thermal conduction seat 24, the first half-moon cavity and the second half-moon cavity would be integrated together to form the central hole 242 of the thermal conduction seat 24.

The first heat pipe 22 can be a flat heat pipe or a plurality of heat pipes. One end of the first heat pipe 22 is protruded into the first block 240 of the thermal conduction seat 24, while another end of the first heat pipe 11 is extended through the first heat-fin set 21 and into the second block 241 of the thermal conduction seat 24.

The first heat-dissipation fan 20 is mounted to the first heat-fin set 21. A lateral shield 23, located under the first heat-fin set 21, is to cover the thermal conduction seat 24 and the microwave magnetron 25.

Figure 7:
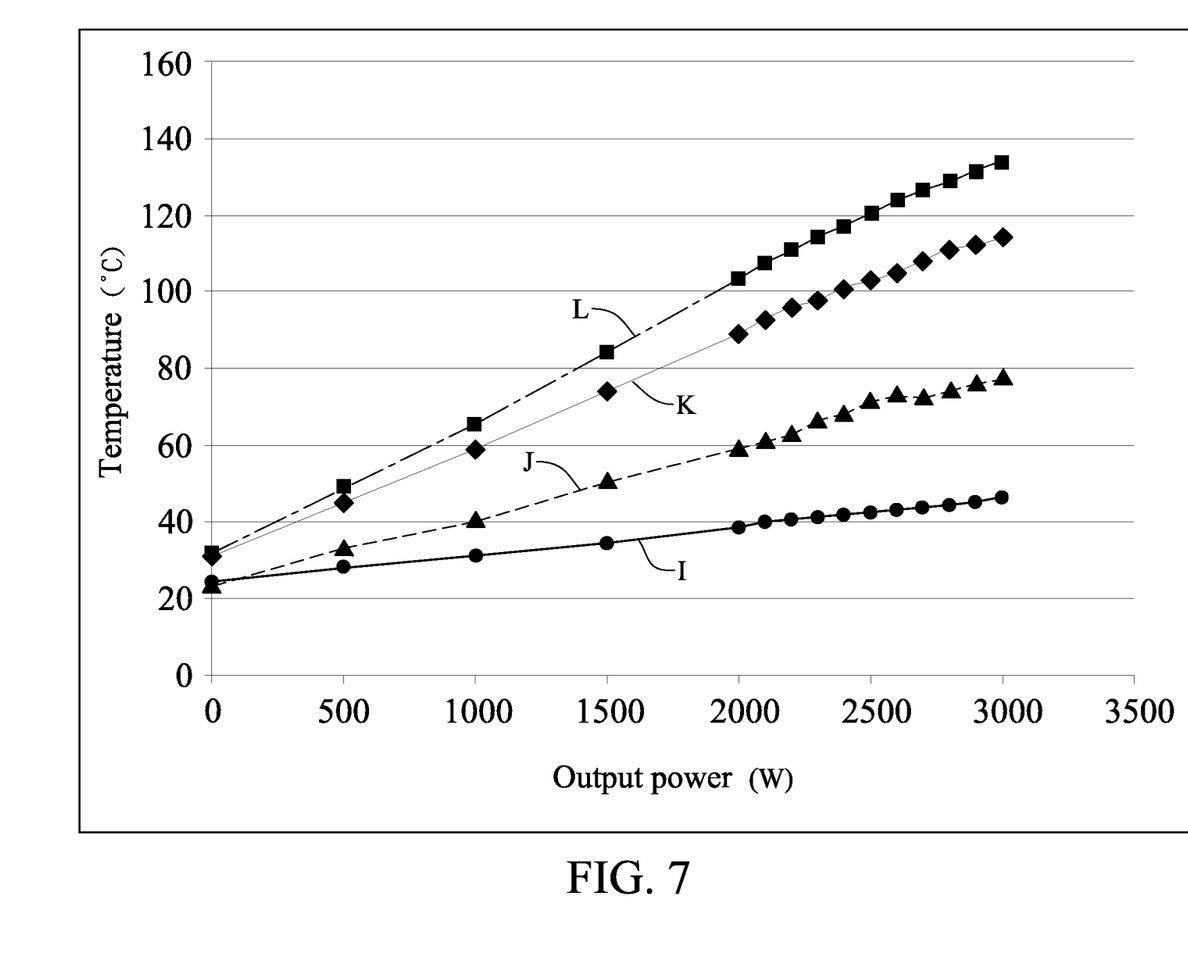
FIG. 7 is a schematic plot of output powers and temperatures at detection points of the microwave magnetron in accordance with the present invention.

Referring now to FIG. 7, as the heat sink apparatus for a microwave magnetron of the present invention is applied by a 3000 W power output, curve L implies that the core temperature is maintained at about 138° C., curve K implies that the thermal conduction seat is maintained at about 114° C., curve J implies that the end of the heat pipe is maintained at about 78° C., and curve I implies that the heat-dissipation fin (either the first-fin set or the second-fin set) is maintained at about 46° C. The aforesaid temperatures are maintained stable during the 1-hour testing. Thus, it is proved that the 3000 W power can be applied to the present invention. In some other examples, it is also proved that the present invention can prevail as well to the magnetrons applied by an even larger power output.

In summary, by comparing to the conventional air-cooling or water-cooling heat-dissipation set, a better heat dissipation performance can be obtained by applying the heat sink apparatus of the present invention.

While the present invention has been particularly shown and described with reference to a preferred embodiment, it will be understood by those skilled in the art that various changes in form and detail may be without departing from the spirit and scope of the present invention.

What is claimed is:

1. A heat sink apparatus for a microwave magnetron, comprising:
   a thermal conduction seat;
   a first heat-fin set; and
   at least one first heat pipe, having one end thereof to protrude into the thermal conduction seat and another end thereof to extend into the first heat-fin set;
   wherein the thermal conduction seat has a central hole for allowing n antenna of a microwave magnetron to penetrate therethrough.

2. The heat sink apparatus for a microwave magnetron of claim 1, further having a first heat-dissipation fan mounted to the first heat-fin set.

3. The heat sink apparatus for a microwave magnetron of claim 1, wherein the first heat-fin set further has a lateral shield, and the first heat pipe is one of a flat heat pipe and a plurality of heat pipes.

4. The heat sink apparatus for a microwave magnetron of claim 1, further having at least one second heat pipe and a second heat-fin set, one end of the second heat pipe penetrating into the thermal conduction seat, another end of the second heat pipe extending into the second heat-fin set.

5. The heat sink apparatus for a microwave magnetron of claim 4, further having a second heat-dissipation fan mounted to the second heat-fin set.

6. The heat sink apparatus for a microwave magnetron of claim 5, wherein the second heat-fin set further has a lateral shield, and the second heat pipe is one of a flat heat pipe and a plurality of heat pipes.

7. The heat sink apparatus for a microwave magnetron of claim 1, wherein the thermal conduction seat has a first block and a second block, the first block has a first half-moon cavity, and the second block has a second half-moon cavity; wherein, as the first block and the second block are paired together to form the thermal conduction seat, the first half-moon cavity and the second half-moon cavity are integrated to form the central hole for allowing the antenna to penetrate therethrough.

8. The heat sink apparatus for a microwave magnetron of claim 7, wherein one end of the first heat pipe penetrates through the first block, and another end of the first heat pipe penetrates through the first heat-fin set and protrudes into the second block.

9. The heat sink apparatus for a microwave magnetron of claim 8, wherein one end of the first heat pipe protrudes into the first heat-fin set, and another end of the first heat pipe protrudes into the first block; wherein one end of the second heat pipe protrudes into the second heat-fin set, and another end of the second heat pipe protrudes into the second block.

10. The heat sink apparatus for a microwave magnetron of claim 4, wherein the thermal conduction seat has a first block and a second block, the first block has a first half-moon cavity, and the second block has a second half-moon cavity; wherein, as the first block and the second block are paired together to form the thermal conduction seat, the first half-moon cavity and the second half-moon cavity are integrated to form the central hole for allowing the antenna to penetrate therethrough.

11. The heat sink apparatus for a microwave magnetron of claim 10, wherein one end of the first heat pipe penetrates through the first block, and another end of the first heat pipe penetrates through the first heat-fin set and protrudes into the second block.

12. The heat sink apparatus for a microwave magnetron of claim 11, wherein one end of the first heat pipe protrudes into the first heat-fin set, and another end of the first heat pipe protrudes into the first block; wherein one end of the second heat pipe protrudes into the second heat-fin set, and another end of the second heat pipe protrudes into the second block.

13. The heat sink apparatus for a microwave magnetron of claim 1, further having a lateral shield located under the first heat-fin set to cover the thermal conduction seat and the microwave magnetron.

* * * * *